(12) United States Patent
Chen et al.

(10) Patent No.: US 9,240,796 B2
(45) Date of Patent: *Jan. 19, 2016

(54) PLL FREQUENCY SYNTHESIZER WITH MULTI-CURVE VCO IMPLEMENTING CLOSED LOOP CURVE SEARCHING

(71) Applicant: Micrel, Inc., San Jose, CA (US)

(72) Inventors: Juinn-Yan Chen, Fremont, CA (US); Wei-Kang Cheng, Milpitas, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/686,368

(22) Filed: Apr. 14, 2015

(65) Prior Publication Data

US 2015/0222279 A1 Aug. 6, 2015

Related U.S. Application Data

(63) Continuation of application No. 13/874,229, filed on Apr. 30, 2013, now Pat. No. 9,030,241.

(51) Int. Cl.
| | |
|---|---|
| *H03L 7/06* | (2006.01) |
| *H03L 7/099* | (2006.01) |
| *H03L 7/085* | (2006.01) |
| *H03L 7/089* | (2006.01) |
| *H03L 7/10* | (2006.01) |
| *H03L 7/197* | (2006.01) |

(52) U.S. Cl.
CPC .............. *H03L 7/099* (2013.01); *H03L 7/085* (2013.01); *H03L 7/0891* (2013.01); *H03L 7/102* (2013.01); *H03L 7/1976* (2013.01); *H03L 2207/06* (2013.01)

(58) Field of Classification Search
None
See application file for complete search history.

(56) References Cited

U.S. PATENT DOCUMENTS

| 6,778,024 B2* | 8/2004 | Gupta et al. ............ 331/16 |
| 7,982,552 B2 | 7/2011 | Shin et al. |
| 2002/0167362 A1* | 11/2002 | Justice et al. .......... 331/11 |
| 2006/0006914 A1* | 1/2006 | Fan-Jiang ............ 327/156 |
| 2008/0100385 A1* | 5/2008 | Lin ..................... 331/16 |
| 2011/0080196 A1* | 4/2011 | Wang et al. .......... 327/156 |

FOREIGN PATENT DOCUMENTS

| KR | 101180144 | 9/2012 |
| KR | 101209030 | 12/2012 |

\* cited by examiner

*Primary Examiner* — Cassandra Cox
(74) *Attorney, Agent, or Firm* — Van Pelt, Yi & James LLP

(57) ABSTRACT

A phase-locked loop circuit using a multi-curve voltage-controlled oscillator (VCO) having a set of operating curves, each operating curve corresponding to a different frequency range over a control voltage range. The phase-locked loop circuit includes a digital control circuit configured to generate a curve select signal using a closed loop curve search operation to select one of the operating curves in the multi-curve VCO, the selected operating curve being used by the VCO to generate an output signal with an output frequency being equal or close to a target frequency of the phase-locked loop. In one embodiment, the digital control circuit implements a binary jump method and an operating curve is selected when the operating curve has an output frequency meeting the target frequency with the control voltage being within a first voltage range being a narrowed and centered voltage range within the control voltage range.

15 Claims, 15 Drawing Sheets

US 9,240,796 B2

PLL FREQUENCY SYNTHESIZER WITH MULTI-CURVE VCO IMPLEMENTING CLOSED LOOP CURVE SEARCHING

CROSS REFERENCE TO OTHER APPLICATIONS

This application is a continuation of U.S. patent application Ser. No. 13/874,229, entitled PLL FREQUENCY SYNTHESIZER WITH MULTI-CURVE VCO IMPLEMENTING CLOSED LOOP CURVE SEARCHING, filed Apr. 30, 2013, now U.S. Pat. No. 9,030,241, issued May 12, 2015, which is incorporated herein by reference for all purposes.

BACKGROUND OF THE INVENTION

The advent of wireless communication leads to increasing demands on wireless communication devices to comply with increasingly complicated communication specifications. A wireless communication device transmits and receives modulated radio frequency (RF) signals, generally in accordance with one or more telecommunication standards. Wireless communication devices typically include a frequency synthesizer to generate the desired modulation frequency for the radio frequency (RF) transmitter and RF receiver. In order to cover multiple frequency bands and to meet the demand of fine frequency step size, fractional-N frequency synthesizers are often employed. Furthermore, wireless communication standards often bind large number of channels into a narrow frequency band. The frequency synthesizer for these wireless applications must be capable of covering the wide frequency range while ensuring low jitter on the output frequency signal.

Phase-locked loops (PLL) are widely used as the basis for frequency synthesizer circuits. A phase-locked loop (PLL) is an electrical circuit that controls an oscillator so that the oscillator maintains a constant phase angle relative to a reference signal. In general, a PLL is formed by a phase detector, a charge pump, a low pass filter, and a voltage-controlled oscillator (VCO). The PLL receives an input signal and operates to control the VCO to lock to the frequency indicated by the input signal so that the output oscillating signal of the VCO maintains a fixed phase relationship with the input signal.

FIG. 1 is a schematic diagram of a conventional phase-locked loop (PLL) circuit. Referring to FIG. 1, a phase-locked loop (PLL) circuit 10 receives an input signal 12 generated by an oscillator 11 having an input frequency $f_{in}$ and generates an output signal 22 having an output frequency $f_{out}$ where the output signal 22 has a fixed relation to the phase of the input signal 12. The PLL circuit 10 may include a frequency divider 13 to divide down the input frequency, such as by a division factor of M, to generate a reference signal 15 having a reference frequency $f_{ref}$. The PLL circuit 10 includes a phase and frequency detector (PFD) 14, a charge pump 16, a low pass filter 18 and a voltage controlled oscillator (VCO) 20. The low pass filter 18, also referred to as a loop filter, is typically implemented as a serial connection of a capacitor and a resistor. PLL circuit 10 also includes a feedback frequency divider 30 forming a negative feedback loop. The feedback frequency divider 30 receives the output signal 22 and generates a feedback signal 34 having a divided-down feedback frequency $f_{fb}$, such as by a division factor of N. The feedback signal 26 is coupled to the phase and frequency detector 14 to form the feedback loop.

The operation of PLL 10 is well known. The phase and frequency detector 14 compares the phase difference between the reference signal 15 and the feedback signal 34. The phase difference is used to control the charge pump 16 which generates a control signal for controlling the VCO 20. The control signal is coupled to the low-pass filter 18 to filter out high frequency changes to generate the control voltage Vctrl for driving the VCO 20. The VCO 20 generates the output signal 22 having a fixed relation to the phase of the input signal. The output signal 22 is fed back to the phase and frequency detector 14 through the feedback frequency divider 30. The output frequency thus generated is a function of the input frequency and the division factors N and M and given as:

$$f_{out} = \frac{N}{M} f_{in}.$$

The VCO of a PLL generates the output frequency based on the control voltage Vctrl applied to a VCO operating curve. In order to generate an output frequency with a wide frequency range, a single-curve VCO may be used but the VCO will need to have a large VCO gain, represented by a steep slope in the single VCO operating curve, as shown in FIG. 2(a). A large VCO gain is often undesirable as small changes in the control voltage Vctrl will lead to large change in the output frequency and resulting in undesirable jitters. In some examples, the jittering problem is controlled by limiting the variation in the control voltage. In other cases, a multi-curve VCO with multiple VCO operating curves, as shown in FIG. 2(b), is used. When a multi-curve VCO is used, each VCO operating curve has a smaller VCO gain, represented by a shallower slope for each curve, while the set of operating curves covers the desired wide frequency range.

FIG. 3 is a schematic diagram of a conventional fractional-N frequency synthesizer incorporating a multi-curve VCO. Referring to FIG. 3, a fractional-N frequency synthesizer 50 is formed using a basic phase-locked loop (PLL) structure including a phase and frequency detector (PFD) 54, a charge pump 56, a low pass filter 58 and a voltage controlled oscillator (VCO) 60. An oscillator 52 may be used to generate the reference frequency $f_{ref}$ as the input signal to the phase and frequency detector 54. A feedback frequency divider 64 is used in the feedback path. The feedback frequency divider 64 is implemented as a multi-modulus divider with a division ratio N, also referred to as the modulus of the divider 64. Accordingly, the output frequency $f_{out}$ is N times the reference frequency $f_{ref}$, given as: $f_{out}=N*f_{ref}$. In a fractional frequency synthesizer, the output frequency $f_{out}$ is a fraction of the input reference frequency $f_{ref}$ and the divider ratio N includes an integer part and a fractional part. As a multi-modulus divider, the feedback divider 30 is implemented as a chain of divider cells and has a given division range.

In operation, the reference frequency $f_{ref}$ is generated from the oscillator 52. The reference frequency $f_{ref}$ is typically a high frequency signal and is divided down by the feedback frequency divider 64 to a desired lower frequency as the output frequency $f_{out}$. The output frequency $f_{out}$ is locked to the reference frequency $f_{ref}$ through the PLL. The feedback frequency divider 64 receives the output frequency $f_{out}$ as the input source frequency and generates a divided down frequency as the feedback frequency $f_{fb}$ to the PLL. The output frequency $f_{out}$ is adjusted by changing the division ratio N of the feedback frequency divider 64. Fine frequency step size can be achieved by constantly swapping the feedback division ratio N between integer numbers, such as from N, to N−1, N+1, N−2, N+2, etc.

The division ratio N of the feedback frequency divider 64 is modulated by a modulator 68. The modulator 68 generates control databits to control the division factor of the divider cells in the divider 64 to realize the desired division ratio N. The modulator 68 receives the feedback frequency $f_{fb}$ and the control databits are generated synchronous to the feedback frequency $f_{fb}$. In practice, the modulator 68 randomizes the choice of the modulus between integers D and D+1 to generate the fractional division ratio N.

When a frequency synthesizer uses a multi-curve VCO, a control circuit is used to select a desired VCO operating curve for a given target output frequency. The operation to select a VCO operating curve is often referred to as "coarse control." After the desired operating curve is selected, the PLL of the frequency synthesizer operates using "fine control" to adjust the control voltage Vctrl driving the VCO to vary the output frequency along the selected VCO operating curve. Conventional methods for coarse control, or searching and selecting an operating curve, in a multi-curve VCO often employ open loop control and often do not select the optimal operating curve. In some cases, the conventional search methods may cause the VCO to be stuck at a sub-optimal operating curve which impedes the operation of the frequency synthesizer.

BRIEF DESCRIPTION OF THE DRAWINGS

Various embodiments of the invention are disclosed in the following detailed description and the accompanying drawings.

FIG. 2(*b*) illustrates an example VCO operating curve for a multi-curve VCO.

DETAILED DESCRIPTION

Figure 1:
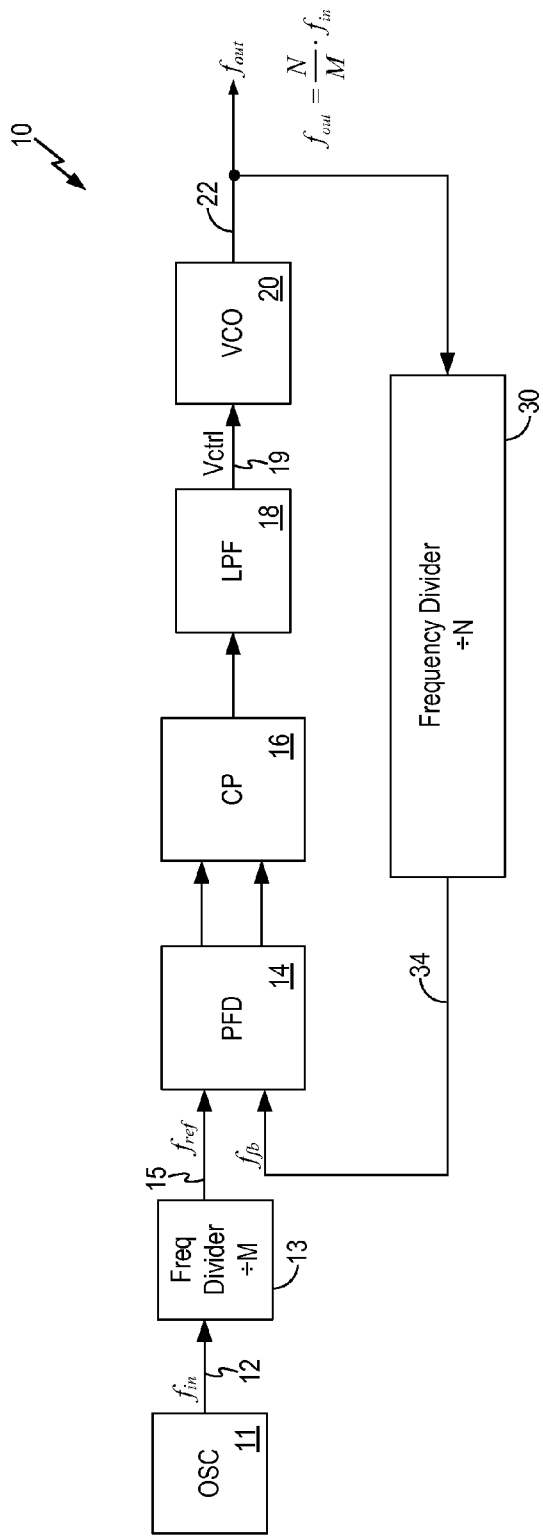
FIG. 1 is a schematic diagram of a conventional phase-locked loop (PLL) circuit.
Figures 2A, 2B:
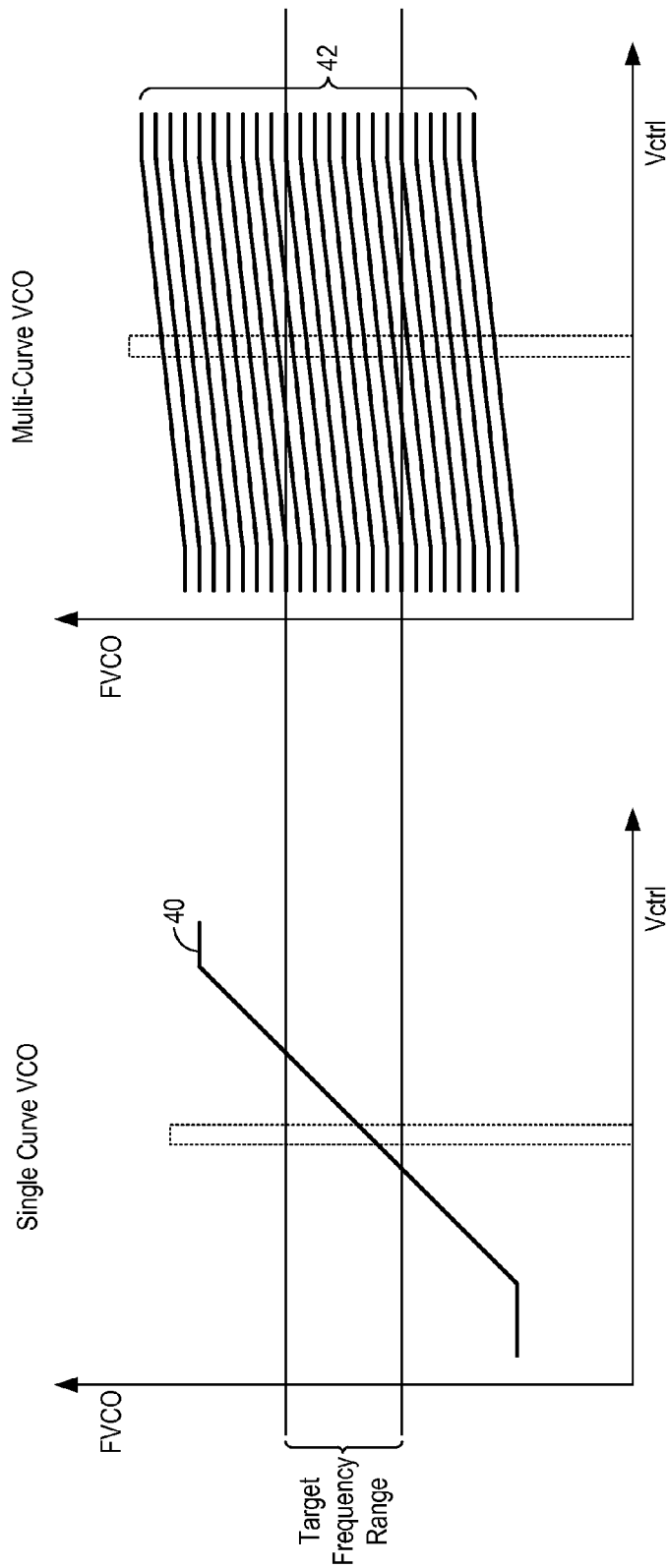
FIG. 2(*a*) illustrates an example VCO operating curve for a single curve VCO.
Figure 3:
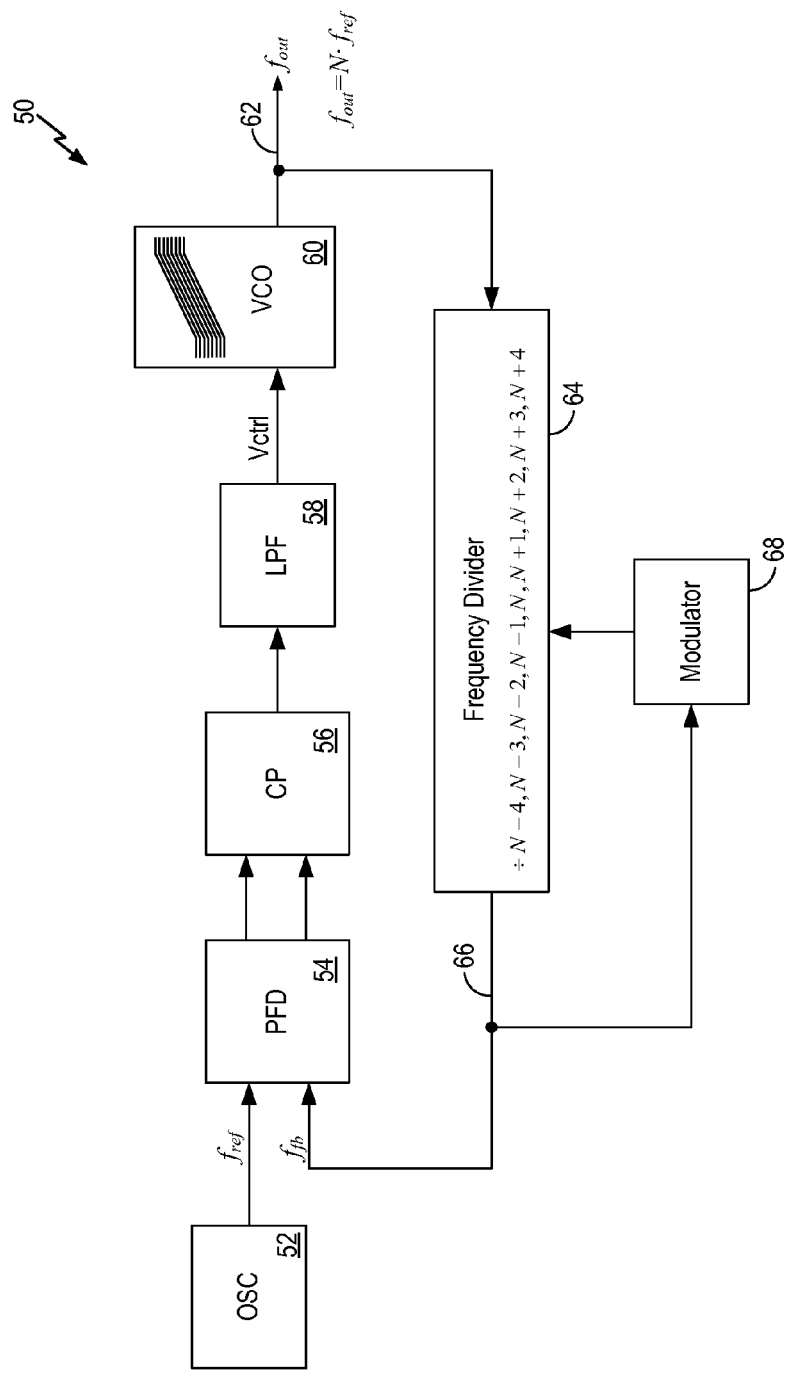
FIG. 3 is a schematic diagram of a conventional fractional-N frequency synthesizer incorporating a multi-curve VCO.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a PLL frequency synthesizer using a multi-curve VCO incorporates a digital control circuit implementing a closed loop curve search method to select an optimal VCO operating curve for a given target frequency. In some embodiments, the closed loop curve search method searches for an operating curve based on a narrowed and centered control voltage range while maintaining the selected operating curve over a wider control voltage range. In this manner, the curve search method ensures the selection of an optimal operating curve. Furthermore, in some embodiments, the closed loop curve search method implements a binary jump method for curve selection during curve searching so that the digital control circuit can be implemented without space consuming adder and subtractor circuits often required when binary search algorithms are used.

In some embodiments, the digital control circuit implements a closed loop curve search method that increases the charge pump current of the PLL to a first level during the curve search operation to increase the speed for the closed loop search to converge. The closed loop curve search method returns the charge pump current to a second, lower level for curve tracking after curve selection. By increasing the charge pump current during the curve search operation, the PLL frequency synthesizer can converge on the optimal VCO operating curve faster while using closed loop search method for more robust curve searching.

The digital control circuit and the closed loop curve search method of the present invention implemented in a PLL frequency synthesizer with a multi-curve VCO realizes many advantages over conventional coarse control techniques. First, the digital control circuit and search method operates to select the optimal VCO operating curve for the target frequency. In the present description, the optimal VCO operating curve is the VCO operating curve that intercepts with the target frequency at a narrowed center range of the VCO control voltage. When the optimal VCO operating curve is selected, the VCO will not be easily saturated or maxed out when the control voltage varies during fine control.

Second, the digital control circuit and curve search method is insensitive to noise over process, voltage, and temperature variations. The PLL frequency synthesizer is capable of selecting the optimal operating curve over process, voltage and temperature variations.

Third, the digital control circuit and curve search method uses a closed loop search algorithm which is more robust than conventional open loop search schemes. In an open loop search scheme, the feedback loop operation of the PLL is broken or interrupted while a control circuit determines the desired operating curve to use. The normal operation of the PLL feedback loop is restored after the operating curve is selected. Open loop search schemes are not desirable as the curve search is not performed under the same conditions as the operating conditions of the PLL. Therefore, open loop search schemes often do not select the ideal curve for the target frequency. However, in embodiments of the present invention, the curve search operation is conducted in closed loop. That is, the feedback loop of the PLL is not broken or interrupted. Instead, the PLL feedback loop continues to operate as the digital control circuit searches for the desired operating curve. In this manner, the operating curve is being selected during the normal operating conditions of the PLL. The operating curve selected using a closed loop search method is thus more robust for the PLL operation.

Forth, in some embodiments, the digital control circuit and curve search method applies increased charge pump current to realize a shorter search time or faster search speed. When the target frequency changes, the closed loop curve search method is capable of searching for the optimal curve quickly due to the increased charge pump current.

Figure 4:
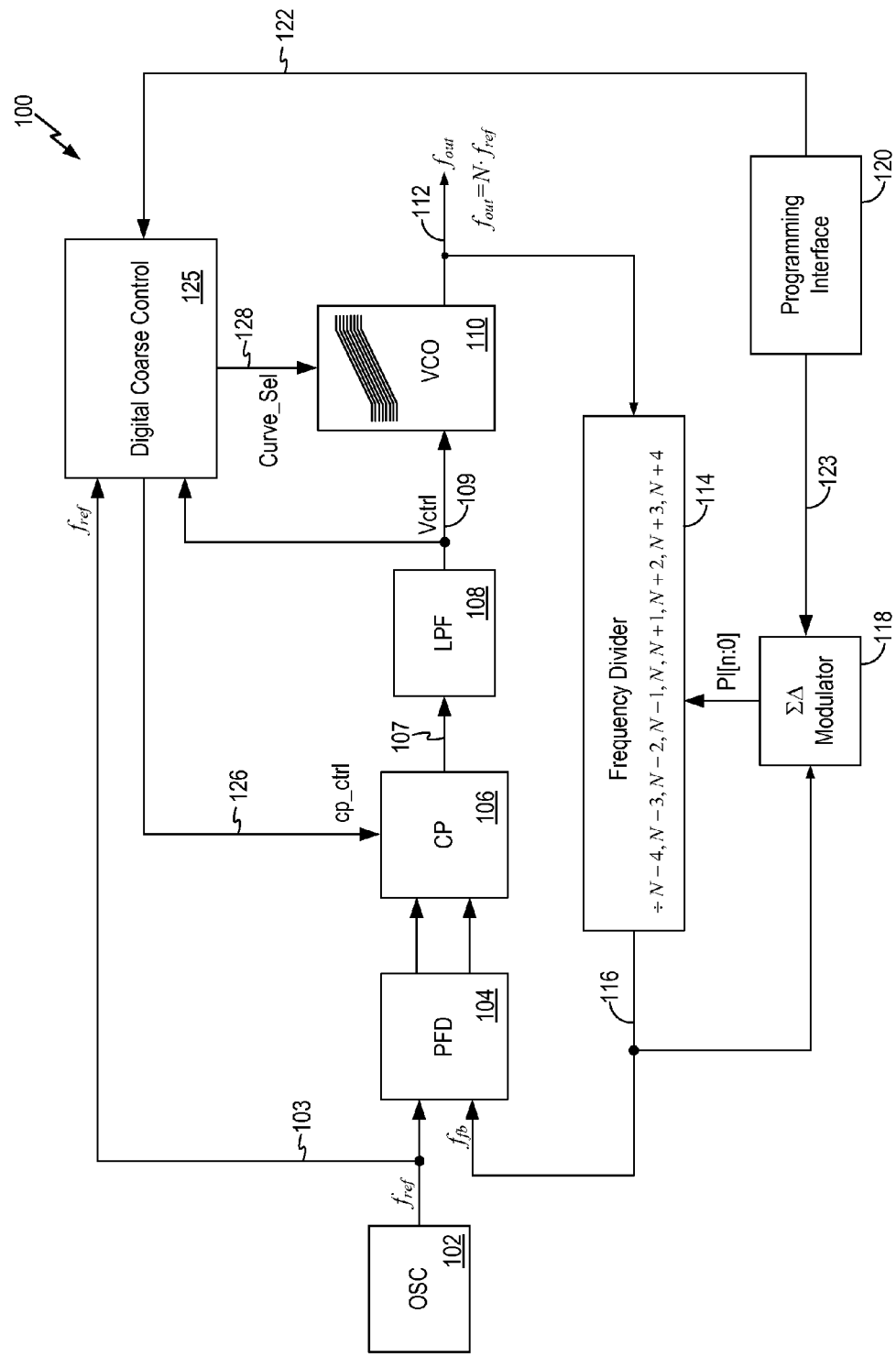
FIG. 4 is a schematic diagram of a fractional-N frequency synthesizer incorporating a multi-curve VCO and a digital control circuit in embodiments of the present invention.

FIG. 4 is a schematic diagram of a fractional-N frequency synthesizer incorporating a multi-curve VCO and a digital control circuit in embodiments of the present invention. Referring to FIG. 4, a fractional-N frequency synthesizer 100 is formed using a phase-locked loop (PLL) circuit including a phase and frequency detector (PFD) 104, a charge pump 106, a low pass filter 108 and a multi-curve voltage controlled oscillator (VCO) 110. A highly accurate and stable frequency source, such as a crystal oscillator 102, may be used to generate the reference frequency $f_{ref}$ as the input signal 103 to the phase and frequency detector 104. A feedback frequency divider 114 is used in the feedback path. The feedback frequency divider 114 is implemented as a multi-modulus divider with a division ratio N, also referred to as the modulus of the divider 114. Accordingly, the output frequency $f_{out}$ is N times the reference frequency $f_{ref}$ given as: $f_{out}=N*f_{ref}$. In a fractional frequency synthesizer, the output frequency $f_{out}$ is a fraction of the input reference frequency $f_{ref}$ and the divider ratio N includes an integer part and a fractional part. The feedback divider 114 in the multi-modulus divider may be implemented as a chain of divider cells and has a given division range.

In operation, the reference frequency $f_{ref}$ is generated from the oscillator 102. The reference frequency $f_{ref}$ is typically a high frequency signal and is divided down by the feedback frequency divider 114 to a desired lower frequency as the output frequency $f_{out}$. The output frequency $f_{out}$ is locked to the reference frequency $f_{ref}$ through the PLL. The feedback frequency divider 114 receives the output frequency $f_{out}$ as the input source frequency and generates a divided down frequency as the feedback frequency $f_{fb}$ to the PLL. The output frequency $f_{out}$ is adjusted by changing the division ratio N of the feedback frequency divider 114. Fine frequency step size can be achieved by constantly swapping the feedback division ratio N between integer numbers, such as from N, to N−1, N+1, N−2, N+2, etc.

The division ratio N of the feedback frequency divider 114 is modulated by a delta-sigma (ΣΔ) modulator 118. The ΣΔ modulator 118 generates control databits PI[n:0] to control the division factor of the divider cells in the divider 114 to realize the desired division ratio N. The ΣΔ modulator 118 receives the feedback frequency $f_{fb}$ and the control databits PI[n:0] are generated synchronous to the feedback frequency $f_{fb}$. In practice, the ΣΔ modulator 118 randomizes the choice of the modulus between integers D and D+1 to generate the fractional division ratio N. The noise shaping effect of the ΣΔ modulator pushes the phase noise to a high level which can be filtered out by the LPF 108.

The PLL operation is as follows. The phase and frequency detector 104 compares the phase difference between the reference frequency $f_{ref}$ and the feedback frequency $f_{fb}$. The phase difference is used to control the charge pump 106 which generates a control signal for controlling the VCO 110. In particular, the PFD 104 generates a pair of charge pump control signals (UP and Down) to cause the charge pump to source or sink current from the output node 107 of the charge pump, therefore generating the control signal for the VCO. The output signal from the charge pump is coupled to the low-pass filter 108 to filter out the high frequency components. The filtered signal is the control voltage Vctrl (node 109) for driving the VCO 110. The VCO 110 generates the output signal 112 with an output frequency $f_{out}$ having a fixed relation to the phase of the reference frequency $f_{ref}$. The output frequency $f_{out}$ is fed back to the phase and frequency detector 104 through the feedback frequency divider 114 to complete the control loop.

When the frequency synthesizer 100 uses a multi-curve VCO 110 in the PLL circuit, the frequency synthesizer 100 applies "coarse control" to select one VCO operating curve out of the set of multiple VCO operating curves that can generate an output frequency meeting the target frequency. In embodiments of the present invention, PLL frequency synthesizer 100 includes a digital control circuit 125 which implements a closed loop curve search method for selecting an optimal VCO operating curve having an output frequency meeting the target frequency. After the desired VCO operating curve is selected, the PLL of the frequency synthesizer operates using "fine control" to adjust the control voltage Vctrl (node 109) driving the VCO to vary the output frequency of the VCO along the selected VCO operating curve.

In embodiments of the present invention, the PLL frequency synthesizer 100 includes a digital control circuit to provide coarse control in selecting an optimal VCO operating curve. Meanwhile, the PLL, including the phase and frequency detector 104, the charge pump 106, the low-pass filter 108 and the feedback frequency divider 114, provides fine control to adjust the control voltage Vctrl to track the target frequency.

In some embodiments, PLL frequency synthesizer 100 includes a programming interface 120 which generates the control signals to select a desired channel or a desired target frequency. When the channel is changed, the programming interface 120 provides the control signals to change the target frequency. The programming interface 120 generates a first control signal (node 123) for the ΣΔ modulator 118 to change the divider ratio of the feedback frequency divider 114. Changing the divider ratio changes the output frequency $f_{out}$ of the PLL. When the target frequency changes, the PLL needs to relock the loop to the new target frequency. The programming interface 120 sends a second control signal (node 122) to the digital control circuit 125 to restart the control circuit to select a new VCO operating curve.

The digital control circuit 125 receives the reference frequency $f_{ref}$ and the control voltage Vctrl (node 109) as input signals. The reference frequency $f_{ref}$ is used as the clock signal to generate the timer signals in the digital control circuit. The control voltage Vctrl is used to select an optimal operating curve for the target frequency using a closed loop curve search method. When the closed loop curve search method determines the optimal operating curve, the digital control circuit 125 generates a curve_sel signal (node 128) for the VCO 110 to use the selected operating curve.

More specifically, in embodiments of the present invention, the closed loop curve search method searches for an operating curve using on a narrowed and centered control voltage range during coarse control. In this manner, the curve search method ensures the selection of an optimal operating curve. Then, the PLL maintains the selected operating curve over a wider control voltage range during fine control. Furthermore, in embodiments of the present invention, the closed loop curve search method implements a binary jump method for curve selection during curve searching so that the digital control circuit can be implemented without space consuming adder or subtractor circuits often required when binary search algorithms are used.

Furthermore, in some embodiments, the digital control circuit generates a charge pump control signal cp_ctrl (node 126) to increase the charge pump current at the charge pump 106 during the coarse control phase or curve searching phase. When the charge pump current is increased, the control voltage Vctrl can settle faster and therefore allow the curve search operation to be completed faster.

Figure 5:
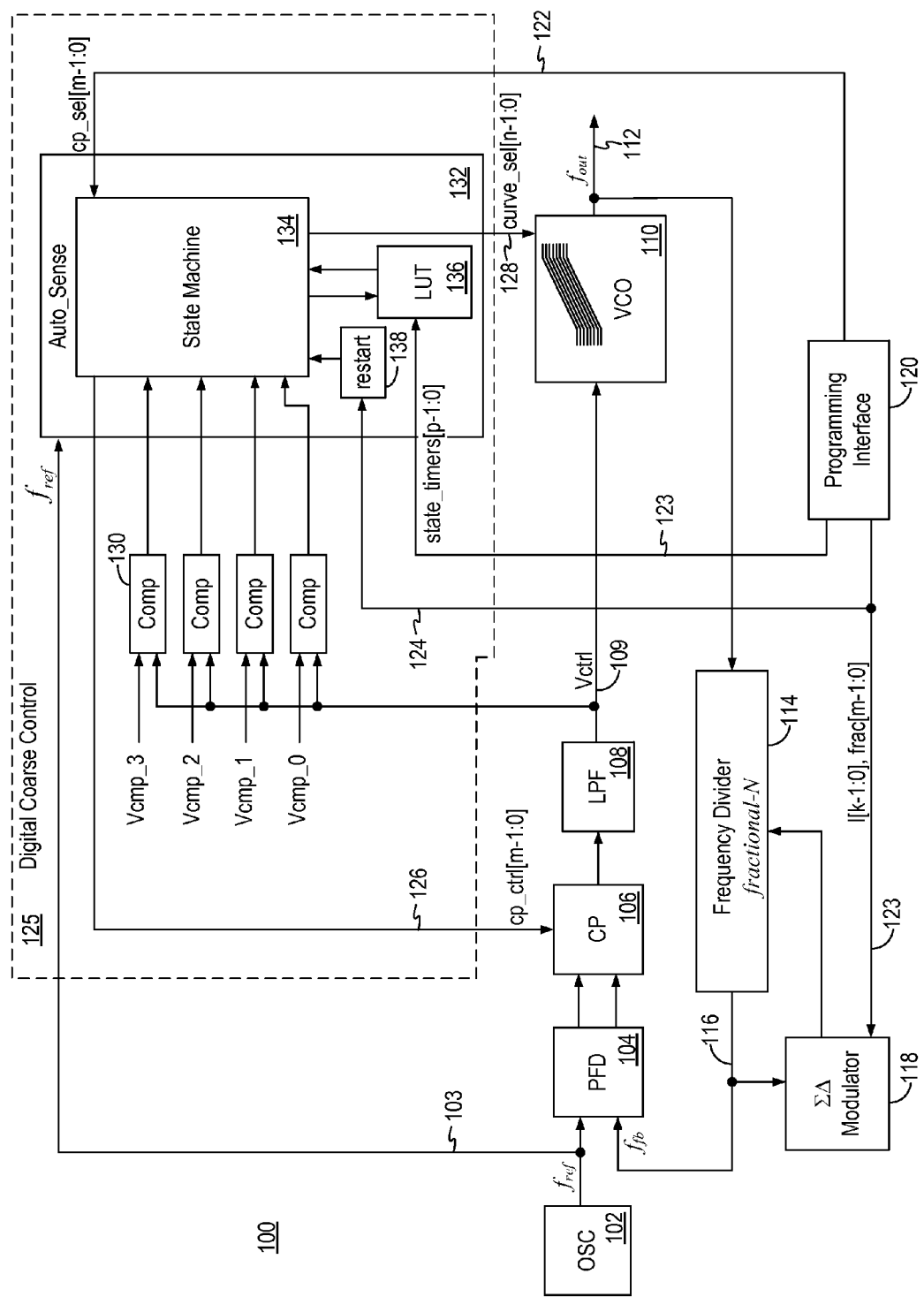
FIG. 5 illustrates the implementation of the digital control circuit in the fractional-N frequency synthesizer of FIG. 4 in embodiments of the present invention.

FIG. 5 illustrates the implementation of the digital control circuit in the fractional-N frequency synthesizer of FIG. 4 in embodiments of the present invention. Like elements in FIGS. 4 and 5 are given like reference numerals and will not be further described. Referring to FIG. 5, in the fractional-N frequency synthesizer 100, the programming interface selects the channel or the target frequency desired for the output frequency $f_{out}$. To select a new target frequency, the programming interface 120 provides a control signal indicating the integer and fraction value for ΣΔ modulator 118 to change the divider ratio of the feedback frequency divider 114. The programming interface 120 further provides a restart control signal (node 124) to a restart circuit 138 in the digital control circuit 125 to restart or initiate the state machine of the digital control circuit. In this manner, the digital control circuit 125 starts up the closed loop curve search method to find an operating curve for the newly established target frequency.

The digital control circuit 125 includes a set of four comparators 130 receiving the control voltage Vctrl 109 and comparing the control voltage Vctrl (node 109) to each of four comparator voltages Vcmp_0 to Vcmp_3. In this manner, the comparators 130 digitize the control voltage Vctrl. The comparison results are given to a state machine 134 to generate the curve select signal curve_sel (node 128). In embodiments of the present invention, the state machine 134 communicates with a look-up table 136 which provides state variables to the state machine. In one embodiment, the look-up table 136 provides state timer values and charge pump current values to the state machine 134, as will be described in more detail below. In the present embodiment, the programming interface 120 provides state timer values to be stored in the look-up table 136. In digital control circuit 125, the state machine 13, the look-up table 136 and the restart circuit 138 form an auto-sense circuit 132 for selecting an appropriate VCO operating curve based on the operating conditions.

Figure 6:
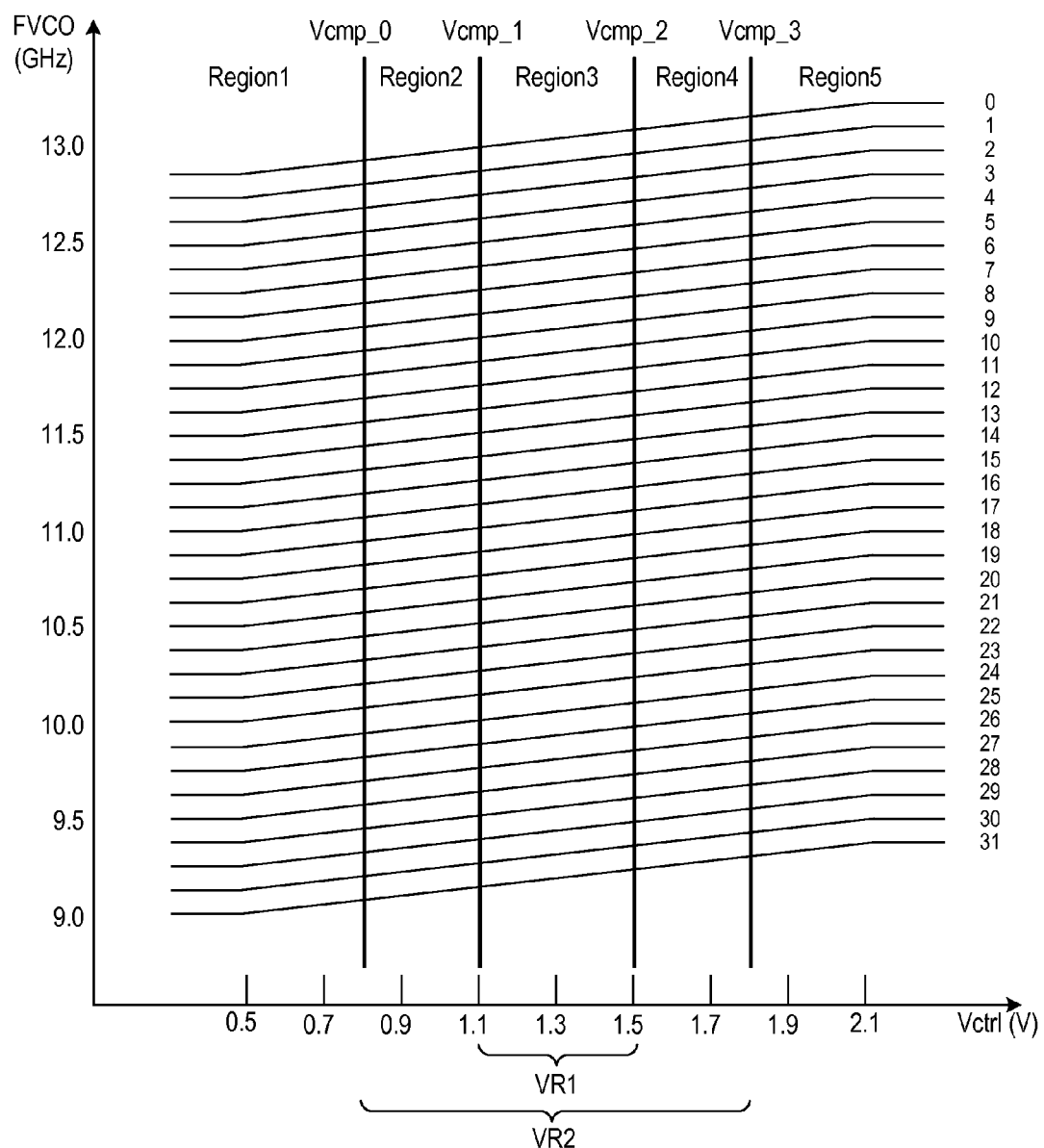
FIG. 6 illustrates the operation curves of a multi-curve VCO in examples of the present invention.

FIG. 6 illustrates the operation curves of a multi-curve VCO in examples of the present invention. Referring to FIG. 6, the multi-curve VCO includes a set of $2^n$ VCO operating curves with each operating curve corresponding to a different frequency range. The curve select signal is used to select one of the $2^n$ operating curves for generating the output frequency. The curve select signal curve_sel is an n-bit value, where n is an integer greater than zero. In the present illustration, the multi-curve VCO is illustrated as including 32 (or $2^5$) operating curves numbered 0 to 31 from the highest frequency to the lowest frequency. The operating curves extend over a control voltage range, which is 0.5V to 2.1V in the present example. The comparator voltages Vcmp_0 to Vcmp_3 represent increasing voltage values that partition the control voltage range into five regions—Region 1 to Region 5. In particular, voltages Vcmp_1 and Vcmp_2 define a first voltage range VR1 being a narrowed and centered control voltage range. That is, the voltage range VR1 represents the center of the entire voltage range of the control voltage. Voltages Vcmp_0 and Vcmp_3 define a second voltage range VR2 being a voltage range wider than the voltage range VR1. In the present example, voltage range VR1 is about 25% of the center of the control voltage while voltage range VR2 is about 50% of the center of the control voltage range. In embodiments of the present invention, an operating curve is selected only when the control voltage Vctrl matches the target frequency within narrow voltage range VR1. In this manner, the digital control circuit 125 ensures the optimal operating curve is selected. The operation of the digital control circuit 125 in selecting an optimal operating curve for a target frequency will be described in more detail below.

In some embodiments, the digital control circuit 125 controls the charge pump current of charge pump 106 to speed up the curve search operation. To that end, the programming interface 120 may provide a signal cp_sel (node 122) to the digital control circuit 125 indicative of the nominal charge pump current. The digital control circuit 125 generates a charge pump control signal cp_ctrl (node 126) to the charge pump 106. The digital control circuit 125 generates the charge pump control signal cp_ctrl to increase the charge pump current 106 during the curve search operations (coarse control) and generates the charge pump control signal cp_ctrl to provide the nominal charge pump current during curve tracking operations (fine control).

Figure 7:
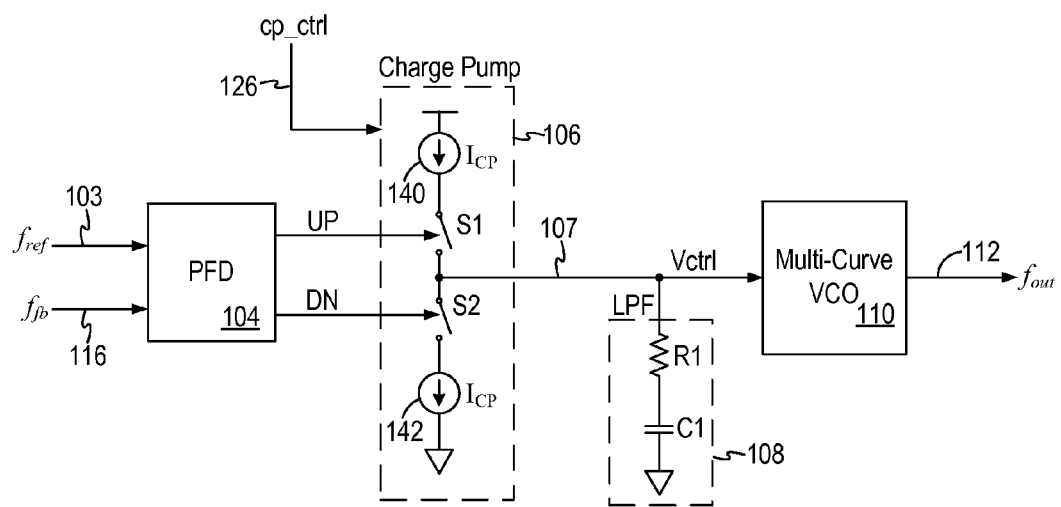
FIG. 7 is a schematic diagram illustrating a charge pump circuit in the PLL frequency synthesizer in embodiments of the present invention.

FIG. 7 is a schematic diagram illustrating a charge pump circuit in the PLL frequency synthesizer in embodiments of the present invention. Referring to FIG. 7, a charge pump circuit 106 includes a first current source 140, a first switch S1, a second switch S2 and a second current source 142, all connected in series between the power supply voltage and ground. Switch S1 is controlled by an Up control signal while switch S2 is controlled by a Down control signal, both generated from the phase and frequency detector 104 in response to the difference between the reference frequency $f_{ref}$ and the feedback frequency $f_{fb}$. When the Up control signal is asserted to close switch S1, the charge pump current from the first current source 140 charges the output node 107. When the Down control signal is asserted to close switch S2, the charge pump current from the second current source 142 discharges the control voltage node 107. Switches S1 and S2 are not turned on at the same time. The low pass filter 108, formed by the serial connection of a resistor R1 and a capacitor C1, is coupled to the output node 107 to low-pass filter the voltage at the output node to generate the control voltage Vctrl. The control voltage Vctrl is then used to drive the VCO 110.

In embodiments of the present invention, the charge pump control signal cp_ctrl (node 126) is provided to the charge pump 106 to set the current values provided by current sources 140 and 142. By providing a larger current, the output node 107 can charge or discharge the low pass filter 108 faster and therefore the control voltage Vctrl can respond faster to changing detection conditions at the PFD 104. However, the noise ripple at the output node is larger. When the charge pump operates at a nominal current level, the output node 107 may not respond as quickly but the noise on the control voltage is minimized.

Figure 8:
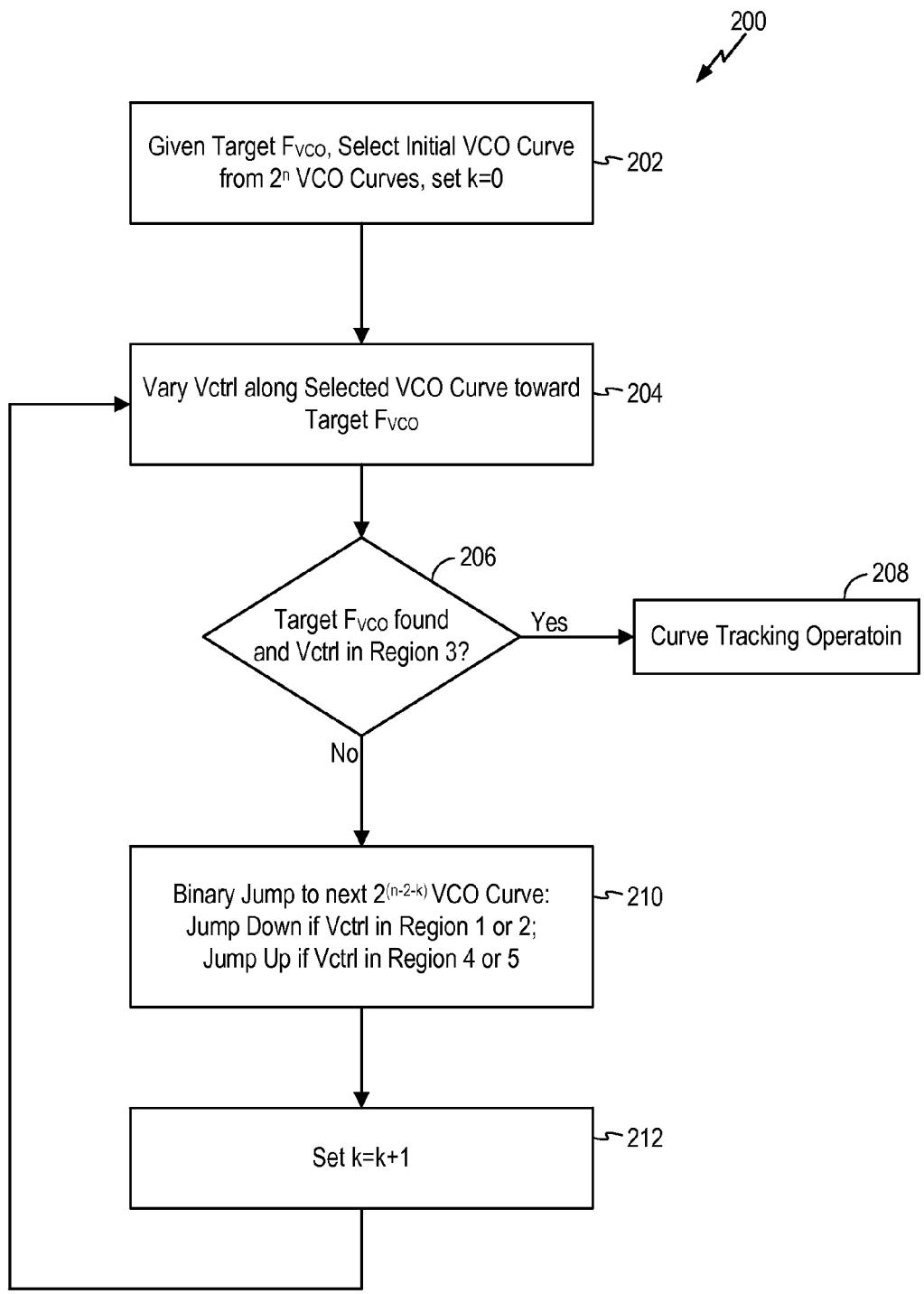
FIG. 8 is a flow chart illustrating the closed loop curve search method for selecting an operating curve for a target frequency in embodiments of the present invention.

The operation of the digital control circuit 125 in PLL frequency synthesizer to select an optimal operating curve will now be described with reference to the flow charts in FIGS. 8-10. FIG. 8 is a flow chart illustrating the closed loop curve search method for selecting an operating curve for a target frequency in embodiments of the present invention. The closed loop curve search method of FIG. 8 will be described with reference to the digital control circuit 125 in FIG. 5 and the VCO operating curves in FIG. 6. The closed loop curve search method will further be described with reference to FIGS. 11 to 15 which illustrate the binary jump method employed by the curve search method and the process of curve selection in the multi-curve VCO of FIG. 6.

Figure 11:
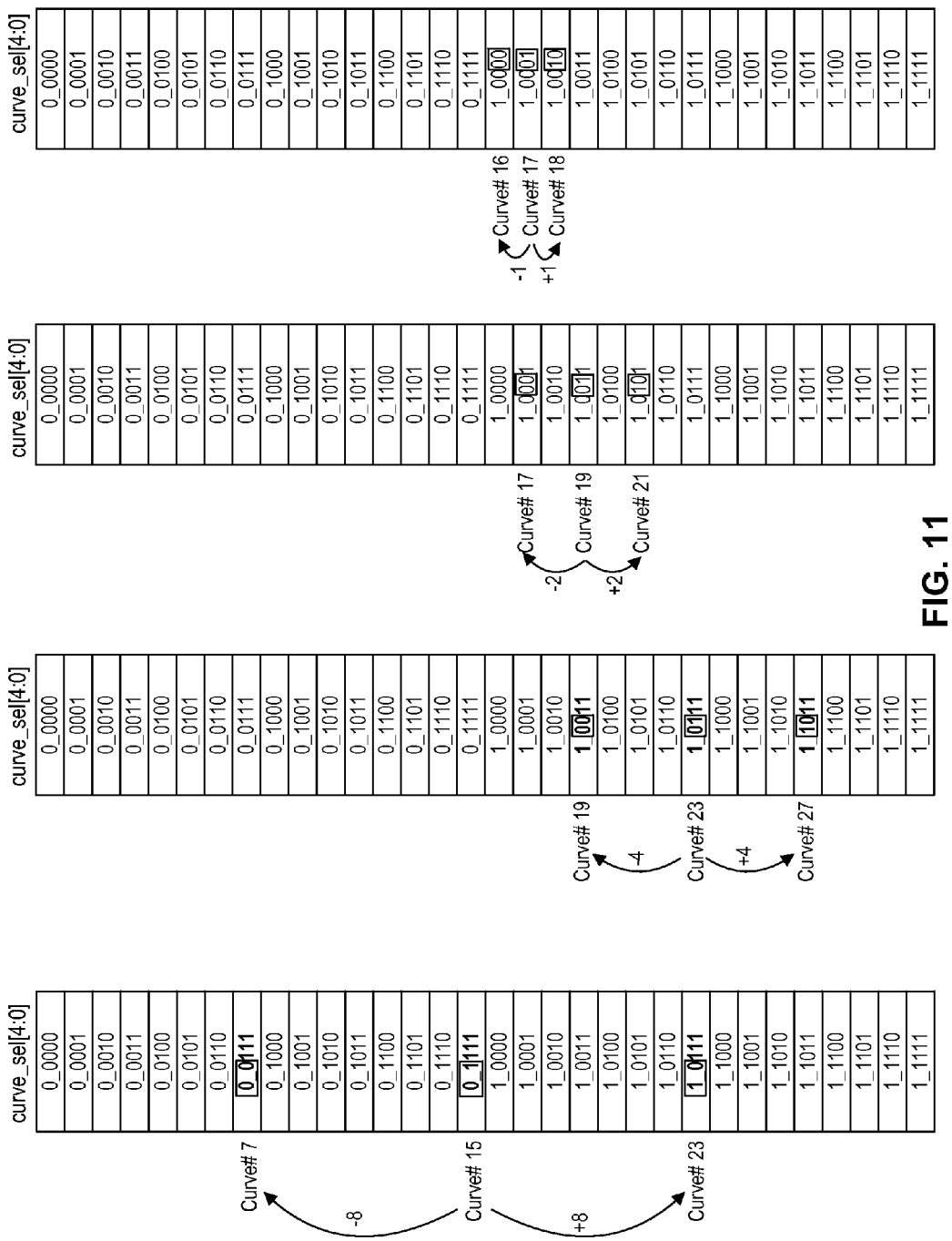
FIG. 11 illustrates an example of the binary jump method used in the closed loop curve search method in embodiments of the present invention.
Figure 12:
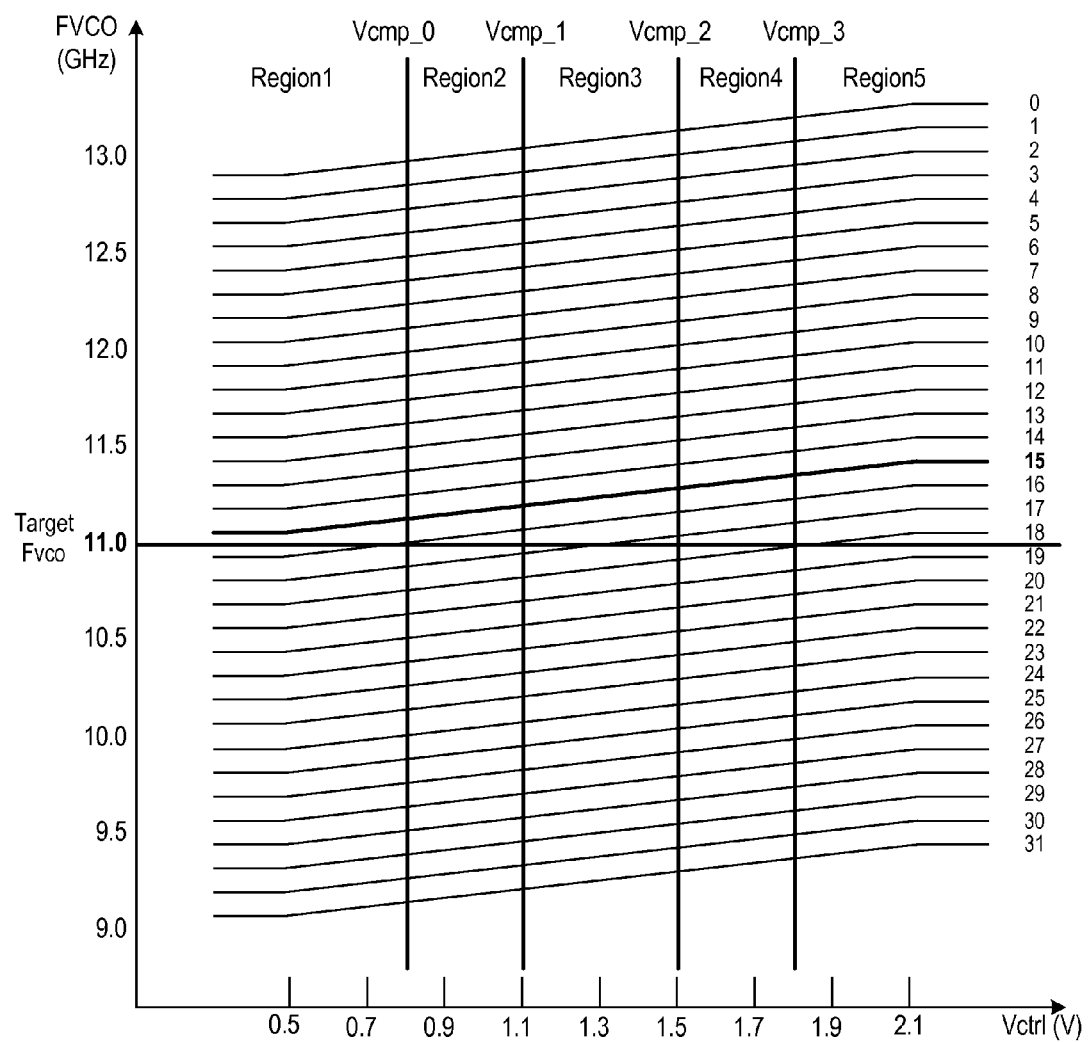
FIGS. 12-15 illustrate a process of selecting an optimal operating curve in a multi-curve VCO for a target frequency using the closed loop curve search method in one example of the present invention.

Referring to FIGS. 8 and 11-15, the closed loop curve search method 200 is initiated when a target frequency for the VCO 110 ("target $F_{VCO}$") is selected, such as the programming interface 120 selects a new target frequency and initiates a restart of the state machine 134. In the present example, the target frequency is 11 GHz. At 202, for the given target $F_{VCO}$, an initial VCO operating curve is selected from $2^n$ VCO operating curves where the curve select signal has n-bits (curve_sel[n–1:0]). For example, the center curve in the set of $2^n$ VCO operating curves can be used as the initial VCO curve. In the present example, curve no. 15 is selected from the 32 VCO curves (FIG. 12) and the curve select signal has 5 bits (curve_sel[4:0]). Referring to FIG. 11, to select curve no. 15, a curve select signal curve_sel having a value of "01111" is provided by the state machine 134 of the digital control circuit 125 to the VCO 110. At 202, the value of a search counter k is initialized to zero.

With the initial curve selected, method 200 varies the control voltage along the selected VCO operating curve to steer the output frequency of the VCO 110 toward the target $F_{VCO}$ (204). At 206, method 200 determines if the target $F_{VCO}$ is found and if the control voltage Vctrl is within region 3, between comparator voltages Vcmp_1 and Vcmp_2. If both conditions are met, then method 200 determines that the optimal curve has been found and the digital control circuit 125 can move to curve tracking operation 208 using the selected operating curve (here, the initial curve). In the present example, curve no. 15 does not intercept with the target frequency of 11 GHz at all (FIG. 12) and voltage Vctrl is determined to be in region 5 when the output frequency is closes to the target frequency. Therefore, the conditions in 206 are not met and method 200 proceeds to step 210.

At 210, method 200 selects the next operating curve by performing a binary jump method. Under the binary jump method, method 200 selects the next operating curve that is $2^{(n-2-k)}$ curve away from the current selected curve. By selecting the next operating curve in $2^{(n-2-k)}$ increments, the digital control circuit only needs to change the values of one or two databits in the n-bit curve select signal curve_sel to generate the curve select signal for the new curve. Complex adding operations used in conventional binary search schemes are not needed. In the present example, k=0 and n=5, thus the binary jump method will select the next operating curve by jumping to a curve that is $2^3$ or 8 curves away from the current curve. Referring to FIG. 11, the binary jump method will select either curve no. 7 or curve no. 23. To select either curve no. 7 or curve no. 23, the digital control circuit 125 only needs to change the value of one or two of the most significant bits of the curve select signal, that is, bit 3 and/or 4 of the curve select signal curve_sel[4:0]. For example, to select curve no. 7, the digital control circuit only needs to change the value of the second to last most significant bit. That is, the curve select signal is changed from "01111" to "00111". To select curve no. 23, the digital control circuit only needs to change the value of the two most significant bits. That is, the curve select signal is changed from "01111" to "10111". The binary jump method used in the curve search method of the present invention is implemented by changing the values of one or two databits in the curve selection signal. The binary jump method enables the digital control circuit to be implemented using simplified circuitry.

The digital control circuit 125 determines whether to jump up to an operating curve at a higher VCO frequency or jump down to an operating curve at a lower VCO frequency based on the value of the control Vctrl when the VCO output frequency is at or is closest to the target frequency. More specifically, method 200 determines in which region the control voltage Vctrl lies when the VCO output frequency is at or is closest to the target frequency by comparing the control voltage Vctrl to the four comparator voltages Vcmp_0 to Vcmp_3. If the control voltage Vctrl is in region 1 or 2, method 200 will jump down to an operating curve with a lower output frequency (which has a higher curve number in the present illustration). If the control voltage Vctrl is in region 4 or 5, method 200 will jump up to an operating curve with a higher output frequency (which has a lower curve number in the present illustration). In the present example (FIG. 12), curve no. 15 is in region 1 when it is closes to the 11 GHz target $F_{VCO}$, therefore method 200 jumps down to curve 23 being an operating curve with a lower output frequency (see FIG. 11 and FIG. 13). Thus, the curve selection signal curve_sel has a value of "10111".

Figure 13:
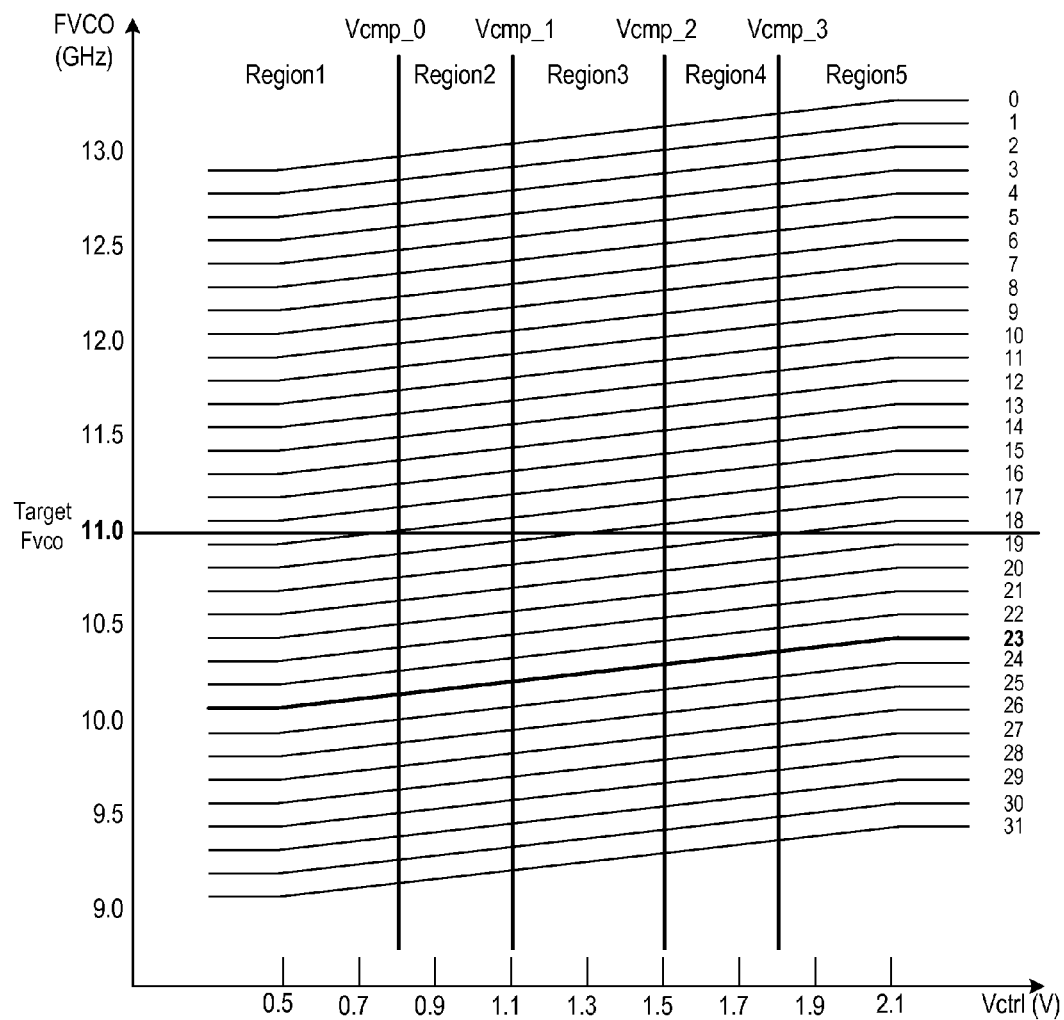
Figure 14:
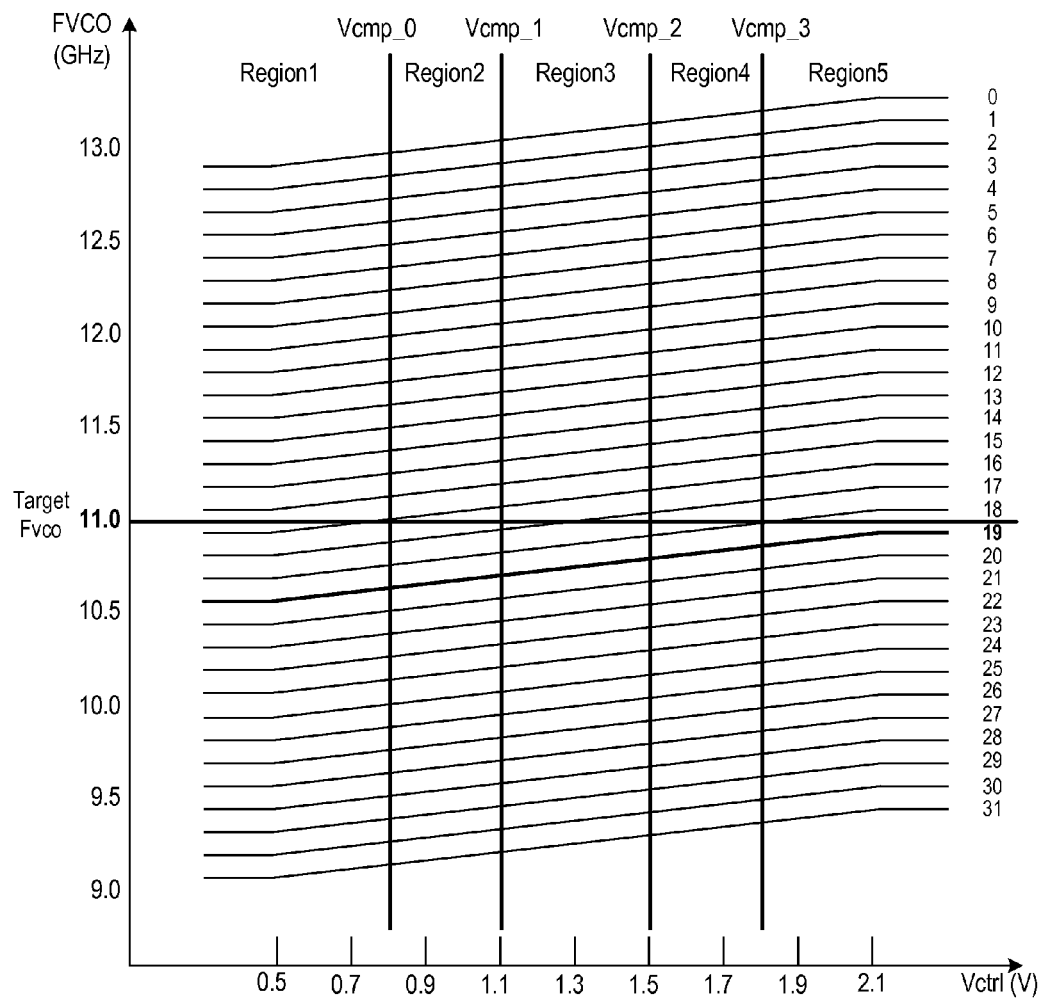

After the next operating curve is selected, method 200 increments the search counter k (212) and method 200 repeats at 204 where the voltage Vctrl is varied along the selected VCO curve toward the target $F_{VCO}$. Referring to FIG. 13, varying the control voltage Vctrl on curve no. 23 up to the highest voltage value (region 5) will still not meet the target frequency. Method 200 then proceeds to 210 when the next curve will be selected. At this increment, k has a value of 1 and the curve search method will jump to the $2^2$ or 4 curves away from curve no. 23 (see FIG. 11). Because voltage Vctrl is in region 5, the method 200 will jump up and select a curve at a higher output frequency. Therefore, curve no. 19 will be selected, as shown in FIG. 14. In this increment, the curve select signal only needs to change one to two bits (bits 2 and/or 3) in order to select the next curve. Thus, to jump from curve no. 23 to curve no. 19, the curve select signal changes from "10111" to "10011".

Figure 15:
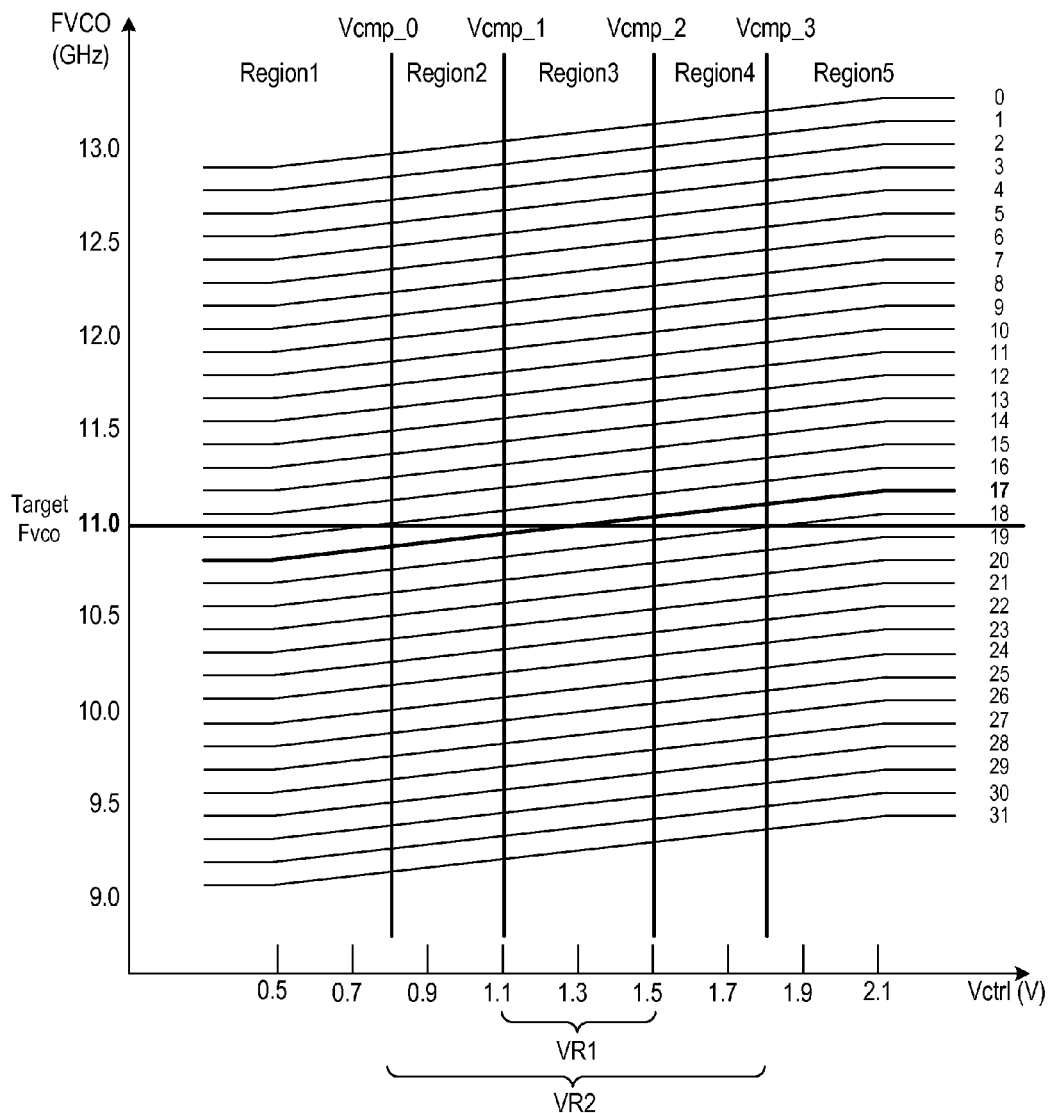

With curve no. 19 selected, method 200 increments the search counter k=2 (212) and repeats at 204 where the voltage Vctrl is varied along the selected VCO curve toward the target $F_{VCO}$. Referring to FIG. 14, varying the control voltage Vctrl on curve no. 19 up to the highest voltage value (region 5) will still not meet the target frequency but it is very close. Method 200 then proceeds to 210 when the next curve will be selected. At this increment, k has a value of 2 and the curve search method will jump to the $2^1$ or 2 curves away from curve no. 19 (see FIG. 11). Because voltage Vctrl is in region 5, the method 200 will jump up and select a curve at a higher output frequency. Therefore, curve no. 17 will be selected, as shown in FIG. 15. In this increment, the curve select signal only needs to change one to two bits (bits 1 and/or 2) in order to select the next curve. Thus, to jump from curve no. 19 to curve no. 17, the curve select signal changes from "10011" to "10001".

With curve no. 17 selected, method 200 increments the search counter k=3 (212) and repeats at 204 where the voltage Vctrl is varied along the selected VCO curve toward the target $F_{VCO}$. Referring to FIG. 15, curve no. 17 intercepts with the target frequency 11 GHz with the control voltage Vctrl in the narrowed and centered region 3. Therefore, the conditions in 206 are met and curve no. 17 is selected as the optimal operating curve and curve tracking operation can begin (208). Curve no. 17 is an optimal operating curve for the PLL frequency synthesizer as the curve intercepts the target $F_{VCO}$ in the center region of the control voltage range such that ample variation of the control voltage is allowed to adjust the output frequency without requiring another VCO curve to be selected.

Figure 9:
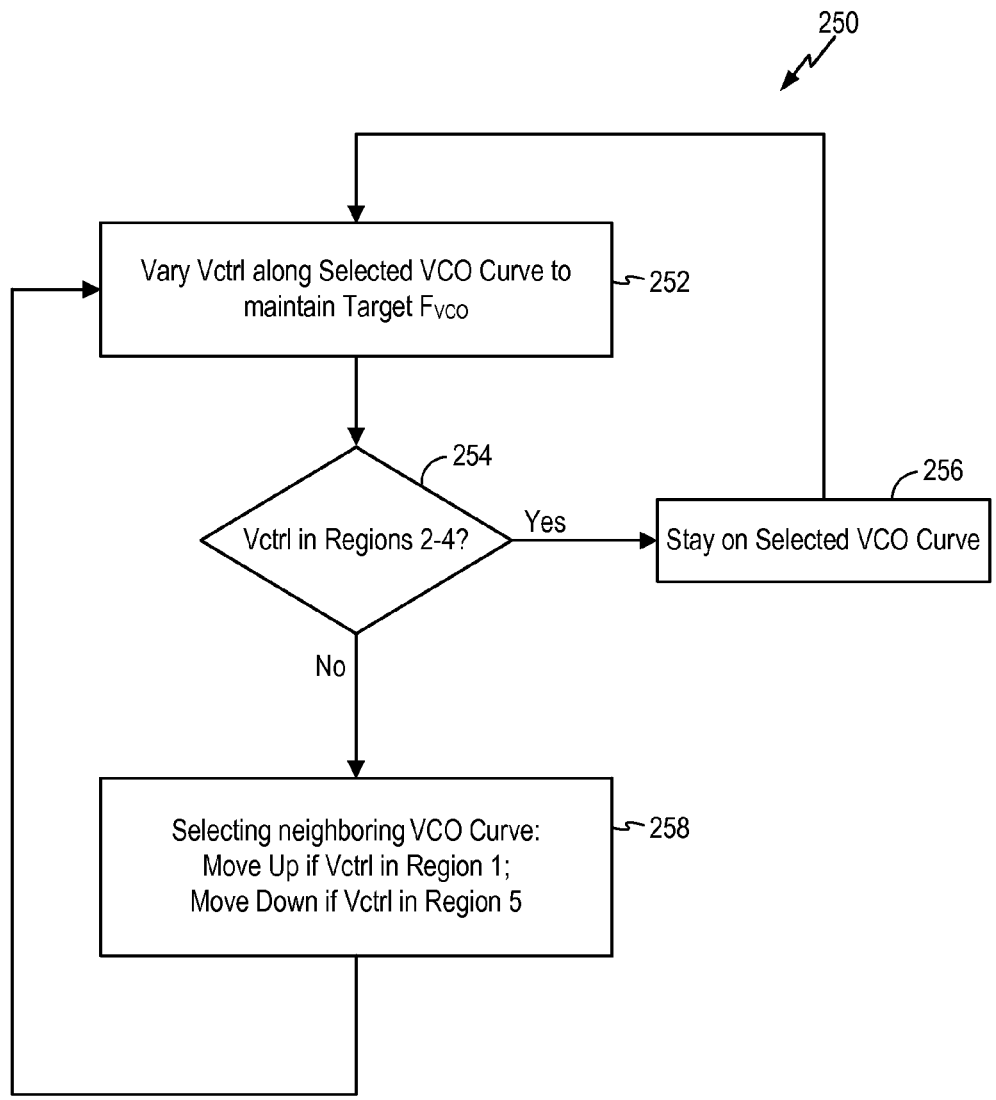
FIG. 9 is a flow chart illustrating the curve tracking method in the digital control circuit according to embodiments of the present invention.

FIG. 9 is a flow chart illustrating the curve tracking method in the digital control circuit according to embodiments of the present invention. Referring to FIG. 9, after a VCO operating curve is selected, the curve tracking method 250 in the digital control circuit 125 varies the control voltage Vctrl along the selected VCO curve to maintain the target frequency over process, temperature and voltage variations (252). Meanwhile, the method 250 determines if the control voltage Vctrl has become driven to the outer bounds of the control voltage range (254). That is, the digital control circuit 125 determines if the control voltage Vctrl is less than comparator voltage Vcmp_0 or greater than comparator voltage Vcomp_3 (see for example, FIG. 15). In other words, method 250 determines if the control voltage Vctrl is within regions 2 to 4 or outside of regions 2-4.

When the control voltage is within regions 2-4 (254) of the control voltage range, method 250 is able to maintain the target frequency by staying on the selected curve. The curve tracking method 250 continues to monitor the control voltage. If the control voltage Vctrl is outside of regions 2 to 4 of the control voltage range, then method 250 proceeds to select a neighboring VCO operating curve (258). If the control voltage is in region 5, method 250 will select the next operating curve up from the current curve (decrease curve no.). If the control voltage is in region 1, method 250 will select the next operating curve down from the current curve (increase curve no.). Method 250 returns to 252 to monitor the control voltage Vctrl. In this manner, once an operating curve is selected, the curve tracking method maintains the target frequency on the selected curve or move to another curve one curve at a time.

According to some embodiments of the present invention, the digital control circuit implements the closed loop curve search method with charge pump current modulation to increase the speed of the curve search operation. FIG. 10 is a flow charge illustrating the closed loop curve search method for selecting an operating curve for a target frequency using charge pup current modulation in embodiments of the present invention. The closed loop curve search method of FIG. 10 will be described with reference to the digital control circuit 125 in FIG. 5 and the VCO operating curves in FIG. 6.

Figure 10:
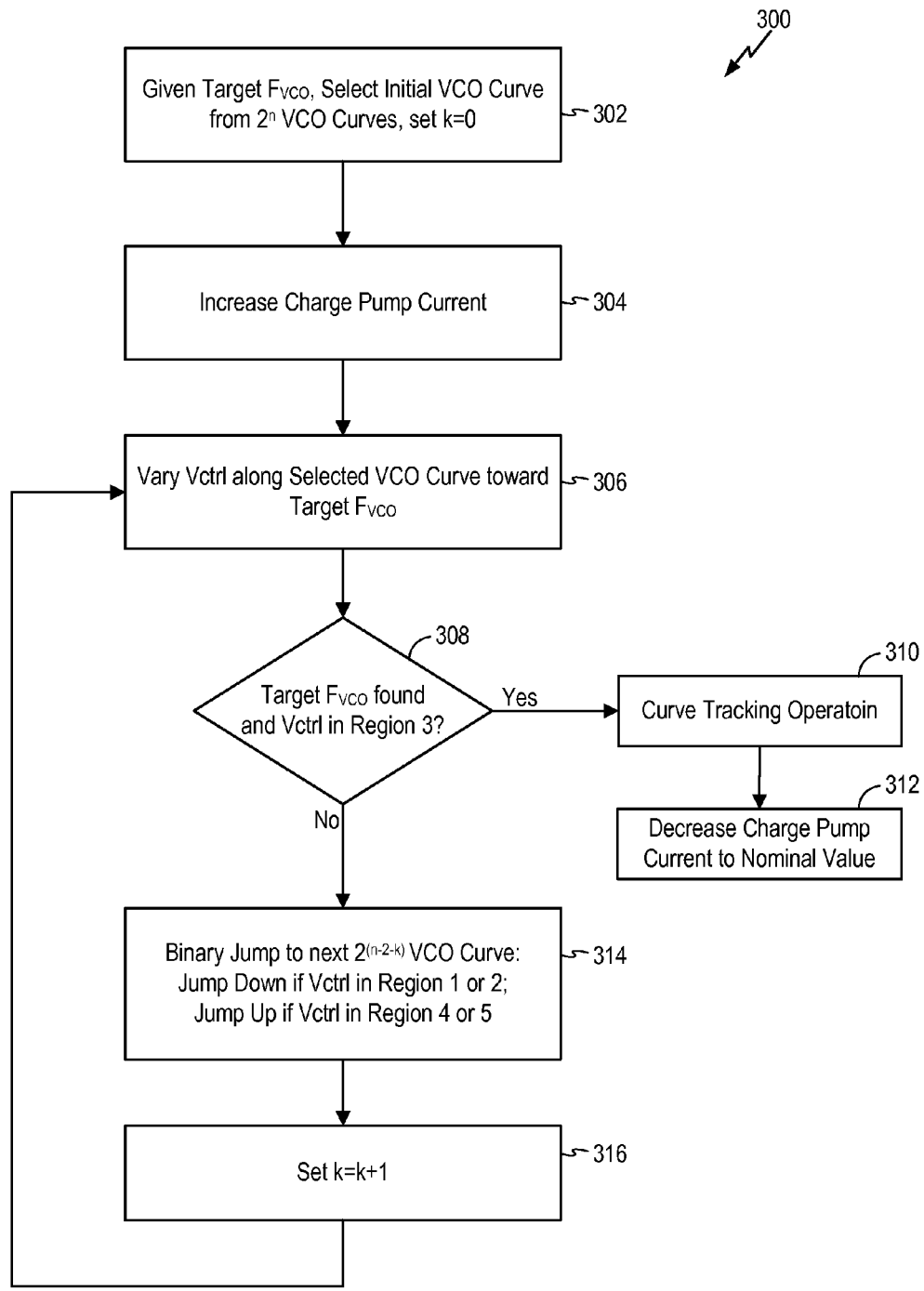
FIG. 10 is a flow charge illustrating the closed loop curve search method for selecting an operating curve for a target frequency using charge pup current modulation in embodiments of the present invention.

Referring to FIGS. 5, 6 and 10, the closed loop curve search method 300 is initiated when a target frequency for the VCO 110 ("target $F_{VCO}$") is selected, such as the programming interface 120 selects a new target frequency and initiates a restart of the state machine 134. At 302, for the given target $F_{VCO}$, an initial VCO operating curve is selected from $2^n$ VCO operating curves where the curve select signal has n-bits (curve_sel[n−1:0]). For example, the center curve in the set of $2^n$ VCO operating curves can be used as the initial VCO curve. At 202, the value of a search counter k is initialized to zero.

At 304, method 300 generates a signal to the charge pump to increase the charge pump current. With the initial curve selected and the increased charge pump current established, method 300 varies the control voltage along the selected VCO operating curve to steer the output frequency of the VCO 110 toward the target $F_{VCO}$ (306). At 308, method 300 determines if the target $F_{VCO}$ is found and if the control voltage Vctrl is within region 3, between comparator voltages Vcmp_1 and Vcmp_2. If both conditions are met, then method 300 determines that the optimal curve has been found and the digital control circuit 125 can move to curve tracking operation 310 using the selected operating curve (here, the initial curve). Method 300 further generates a signal to decrease the charge pump current to a nominal value (312).

On the other hand, when the conditions in 308 are not met, method 300 proceeds to step 314 to select the next operating curve by performing a binary jump method. Under the binary jump method, method 300 selects the next operating curve that is $2^{(n-2-k)}$ curve away from the current selected curve. The digital control circuit 125 determines whether to jump up to an operating curve at a higher VCO frequency or jump down to an operating curve at a lower VCO frequency based on the value of the control Vctrl when the VCO output frequency is at or is closest to the target frequency. If the control voltage Vctrl is in region 1 or 2, method 300 will jump down to an operating curve with a lower output frequency (which has a higher curve number in the present illustration). If the control voltage Vctrl is in region 4 or 5, method 300 will jump up to an operating curve with a higher output frequency (which has a lower curve number in the present illustration). After the next operating curve is selected, method 300 increments the search counter k (316) and method 300 repeats at 306 where the voltage Vctrl is varied along the selected VCO curve toward the target $F_{VCO}$. While method 300 remains in the curve search mode, the charge pump current remains at the increased current level to increase the response time of the control voltage.

According to embodiments of the present invention, the digital control circuit 125 uses the look-up table 136 to store state timer values. The state timer values can be used to reduce the settling time and increase the speed for the curve searching operation. In some embodiments, the look-up table 136 stores state timer values for different operating states of the state machine. In the present description, the state timer values refers to the settling time of the control voltage or the wait time of the state machine 134 before measurements are taken at the output of the comparators 130. When different state timer values provided in the look-up table 136, state machine 134 uses a shorter state time values as the curve search method converges close to the target frequency. In this manner, the wait time to assess the comparator output signals is reduced as the curve searching is converging to the target frequency. The speed of the curve search method can be increased. For example, when the search counter k is small, such as 0 or 1, a longer state timer value can be used. When the search counter k increments to a higher value, such as 2 or 3, a shorter state timer value can be used.

In other embodiments, the digital control circuit 125 uses the look-up table 136 to store charge pump current values. The charge pump current values can be used to increase the speed for the curve searching operation. In some embodiments, the look-up table 136 stores charge pump current values for different operating states of the state machine. For example, a larger charge pump current value can be used during the initial search states and smaller charge pump current values close to the nominal charge pump current value can be used when the curve search method converges close to the target frequency. In this manner, an increased charge pump current can be used to speed up the curve search operation. A larger charge pump current can help the PLL charge or discharge the loop filter faster so that the control voltage can change faster but the control voltage may have larger ripples. As the curve searching method is getting close to reaching the target frequency in the center region 3, the charge pump current is reduced to reduce the ringing on the control voltage Vctrl so that accurate control voltage measurement can be obtained with shorter settling time. For example, when the search counter k is small, such as 0 or 1, a larger charge pump current can be used. When the search counter k increments to a higher value, such as 2 or 3, a shorter charge pump current can be used.

Returning to FIG. 11, the binary jump method implemented in the closed loop search method of the present invention is distinguishable from the conventional binary search schemes in that no adding or subtracting is used to determine the next step from the current step. For example, when curve no. 15 is selected, in a conventional binary search method, the curve no. 15 will be divided in half to arrive at the step size of 7 and then the value 7 is either added or subtracted from the value 15. The adding and subtracting circuits are space consuming. In embodiments of the present invention, the binary jump method looks at the n-bit of the curve selection signal and operates only on a subset of the bits. For example, in the above embodiments, the binary jump method operates on 2 bits of the n-bit curve select signal. In other embodiments, the binary jump method can operate on any q number of bits of the curve select signal, where q is an integer between 1 and less than n−1.

In the binary jump method, at each state of curve searching, the binary jump method takes q number of bits of the curve select signal and flips one or more of the q number of bits to determine the next curve location. For example, from curve 15, flipping the second most significant bit results in a jump of 8 steps up and flipping the first and second most significant bits result in a jump of 8 steps down.

In the first search step, the q most significant bits are used to determine the next curve location. In the next search step, the q most significant bits of the n−1 bits are used to obtain a smaller step change. The q bits are progressively applied from the most significant bits to the least significant bits of the curve select signal so that the binary jumping starts at a large jump step (coarse) but progressively reduces to finer jump steps. The curve search method using binary jump continues until the q least significant bits are used.

In the above-described examples, the multi-curve VCO has 32 operating curves. In actual practice, the multi-curve VCO can have $2^n$ number of curves with each curve being identified by an n-bit curve select signal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A phase-locked loop circuit using a multi-curve voltage-controlled oscillator (VCO) having a plurality of operating curves, each operating curve corresponding to a different frequency range over a control voltage range, the phase-locked loop configured to receive an input signal having a reference frequency and to generate a control voltage to control the multi-curve VCO to generate an output signal using the one of the plurality of operating curves, the output signal having a fixed relation to the phase of the input signal, the phase-locked loop circuit comprises:
a digital control circuit configured to generate a curve select signal using a closed loop to curve search operation to select one of the plurality of operating curves in the multi-curve VCO, the selected operating curve being used by the VCO to generate an output signal with an output frequency being equal or close to a target frequency of the phase-locked loop,
wherein the digital control circuit implements a binary jump method for choosing one or more operating curves from the plurality of operating curves to search for the selected operating curve, the digital control circuit generates the curve select signal to select one of the one or more operating curves as the selected operating curve in response to the operating curve having an output frequency meeting the target frequency with the control voltage being within a first voltage range being a narrowed and centered voltage range within the control voltage range; and
wherein the digital control circuit is configured to track the target frequency using the selected operating curve in response to the control voltage being within a second voltage range greater than the first voltage range.

2. The phase-locked loop circuit of claim 1, wherein the curve select signal comprises an n-bit signal and the multi-curve voltage-controlled oscillator has $2^n$ operating curves, where n is an integer greater than zero, the digital control circuit implements the binary jump method to choose the one or more operating curves by changing the logical state of a subset of q bits of the n-bit curve select signal, q being an integer between 1 and less than n−1, the subset of q bits of the curve select signal being selected starting from the most significant bit of the n-bit curve select signal to the least significant bit of the n-bit curve select signal over successive searches using the binary jump method.

3. The phase-locked loop circuit of claim 2, wherein the digital control circuit implements the binary jump method to choose the one or more operating curves by changing the logical state of at most two bits of the curve select signal, the at most two bits of the curve select signal being selected starting from the most significant bit to the least significant bit of the n-bit curve select signal over successive searches using the binary jump method.

4. The phase-locked loop circuit of claim 1, wherein the first voltage range comprises a voltage range being about 25% and centered about the control voltage range.

5. The phase-locked loop circuit of claim 1, wherein the digital control circuit comprises a comparator circuit configured to compare the control voltage to each of first and second comparator voltages, the first and second comparator voltages defining a lower limit and an upper limit of the first voltage range within the control voltage range.

6. The phase-locked loop circuit of claim 1, wherein the digital control circuit comprises a comparator circuit configured to compare the control voltage to each of a plurality of comparator voltages, the plurality of comparator voltages comprising first and second comparator voltages defining the first voltage range within the control voltage range, and a third and a fourth comparator voltages defining the second voltage range within the control voltage range, the digital control circuit comparing the control voltage to the plurality of comparator voltages to determine when the control voltage is within the first voltage range or the second voltage range.

7. The phase-locked loop circuit of claim 1, wherein the digital control circuit further comprises a look-up table configured to store a plurality of state timer values, the state timer values being used by the closed loop curve search method to determine a wait time before assessing the control voltage, the digital control circuit applying a longer state time value in response to the operating curves being distant from the target frequency and applying a shorter state time value in response to the operating curves being closer to the target frequency.

8. The phase-locked loop circuit of claim 1, wherein the phase-locked loop circuit further comprises a phase and frequency detector configured to receive the input signal and a feedback signal and generate one or more control signals for controlling a charge pump in response to the phase difference between the input signal and the feedback signal, the charge pump providing a charge pump current to drive a control voltage node to generate the control voltage, and wherein the digital control circuit is configured to increase the charge pump current above a nominal current value during the closed loop curve search operation to select one of the plurality of operating curves in the multi-curve VCO.

9. The phase-locked loop circuit of claim 8, wherein the digital control circuit further comprises a look-up table configured to store a plurality of charge pump current values, the charge pump current values comprising a first charge pump current value being used by the digital control circuit during the closed loop curve search operation and a second charge pump current value being used by the digital control circuit after the closed loop curve search operation.

10. A method for operating a phase-locked loop circuit using a multi-curve voltage-controlled oscillator (VCO) having a plurality of operating curves, each operating curve corresponding to a different frequency range over a control voltage range, the method comprising:
receiving an input signal having a reference frequency and generating a control voltage to control the multi-curve VCO to generate an output signal using one of the plurality of operating curves, the output signal having a fixed relation to the phase of the input signal;
generating a curve select signal to select an operating curve from the plurality of operating curves using a closed loop curve search operation;
using the selected operating curve to generate the output signal with an output frequency being equal or close to a target frequency of the phase-locked loop; and
tracking the target frequency using the selected operating curve in response to the control voltage being within a second voltage range greater than the first voltage range,
wherein the closed loop curve search operation comprises:
choosing, using a binary jump method, one or more operating curves from the plurality of operating curves to search for the selected operating curve;
for each chosen operating curve, varying the control voltage to generate an output signal from the VCO using the currently chosen operating curve;
determining, for each chosen operating curve, if the output signal has an output frequency that meets the target frequency with the control voltage being within a first voltage range being a narrowed and centered voltage range within the control voltage range; and
in response to a first operating curve having an output frequency that meets the target frequency with the control voltage being within the first voltage range, generating the curve select signal to select the first operating curve, the selected operating curve being used by the VCO to generate the output signal.

11. The method of claim 10, wherein choosing, using a binary jump method, one or more is operating curves from the plurality of operating curves to search for the selected operating curve comprises:
choosing the one or more operating curves from the plurality of operating curves using a binary jump method, wherein the binary jump method comprises:
identifying each operating curve using an n-bit curve selection signal, the multi-curve voltage-controlled oscillator comprising $2^n$ operating curves and n is an integer greater than zero; and
choosing the one or more operating curves by changing the logical state of a subset of q bits of the n-bit curve select signal, q being an integer between 1 and less than n−1, the subset of q bits of the curve select signal being selected starting from the most significant bit of the n-bit curve select signal to the least significant bit of the n-bit curve select signal over successive searches using the binary jump method.

12. The method of claim 11, wherein choosing the one or more operating curves by changing the logical state of at least one bit of the curve select signal comprises choosing the one or more operating curves by changing the logical state of at most two bits of the n-bit curve select signal.

13. The method of claim 10, wherein the first voltage range comprises a voltage range being about 25% and centered about the control voltage range.

14. The method of claim 10, wherein determining, for each chosen operating curve, if the output signal has an output frequency that meets the target frequency with the control voltage being within a first voltage range comprises:
comparing the control voltage to a first comparator voltage and a second comparator voltage, the first and second comparator voltages defining the first voltage range within the control voltage range.

15. The method of claim 10, further comprising:
increasing a charge pump current above a nominal level during the closed loop curve search operation.

* * * * *

UNITED STATES PATENT AND TRADEMARK OFFICE
CERTIFICATE OF CORRECTION

| | | |
|---|---|---|
| PATENT NO. | : 9,240,796 B2 | Page 1 of 1 |
| APPLICATION NO. | : 14/686368 | |
| DATED | : January 19, 2016 | |
| INVENTOR(S) | : Juinn-Yan Chen et al. | |

It is certified that error appears in the above-identified patent and that said Letters Patent is hereby corrected as shown below:

In the claims

In Column 13, Claim 1, Line 62, cancel "using a closed loop to curve search" and substitute --using a closed loop curve search--.

In Column 16, Claim 11, Line 10, cancel "one or more is operating curves" and substitute --one or more operating curves--.

Signed and Sealed this
Ninth Day of August, 2016

Michelle K. Lee
*Director of the United States Patent and Trademark Office*